(12) United States Patent
Salvatore et al.

(10) Patent No.: US 6,574,260 B2
(45) Date of Patent: Jun. 3, 2003

(54) ELECTROABSORPTION MODULATED LASER

(75) Inventors: Randal A. Salvatore, Waltham, MA (US); Richard T. Sahara, Watertown, MA (US); Hanh Lu, North Andover, MA (US)

(73) Assignee: Corning Lasertron Incorporated, Bedford, MA (US)

( * ) Notice: Subject to any disclaimer, the term of this patent is extended or adjusted under 35 U.S.C. 154(b) by 35 days.

(21) Appl. No.: 09/809,725

(22) Filed: Mar. 15, 2001

(65) Prior Publication Data

US 2002/0131466 A1 Sep. 19, 2002

(51) Int. Cl.⁷ .............................. H01S 5/026; H01S 5/22
(52) U.S. Cl. .............................. 372/50; 372/26; 372/46
(58) Field of Search ............................ 372/50, 26, 102, 372/46

(56) References Cited

U.S. PATENT DOCUMENTS

| | | | |
|---|---|---|---|
| 4,101,845 A | 7/1978 | Russer | 331/94.5 |
| 4,622,674 A | 11/1986 | Mito | 372/45 |
| 4,675,873 A | 6/1987 | Miller | 372/19 |
| 4,829,535 A | 5/1989 | Utaka | 372/50 |
| 4,905,253 A | 2/1990 | Chraplyvy et al. | 372/96 |
| 4,961,198 A | 10/1990 | Ishino et al. | 372/50 |
| 5,019,519 A | 5/1991 | Tanaka et al. | 437/22 |
| 5,175,643 A | 12/1992 | Andrews | 359/339 |
| 5,184,247 A | 2/1993 | Schimpe | 359/344 |
| 5,212,704 A | 5/1993 | Chen et al. | 372/46 |
| 5,252,839 A | 10/1993 | Fouquet | 257/13 |
| 5,305,343 A | 4/1994 | Allovon et al. | 372/50 |
| 5,394,260 A | 2/1995 | Suzuki et al. | 359/158 |
| 5,548,607 A * | 8/1996 | Tsang | 372/26 |
| 5,553,091 A | 9/1996 | Delorme | 372/50 |
| 5,568,311 A | 10/1996 | Matsumoto | 359/344 |
| 5,581,572 A | 12/1996 | Delorme et al. | 372/50 |
| 5,680,411 A | 10/1997 | Ramdane et al. | 372/50 |
| 5,748,660 A | 5/1998 | Delorme et al. | 372/50 |
| 5,838,714 A | 11/1998 | Delorme | 372/96 |
| 5,883,914 A | 3/1999 | Kinoshita | 372/50 |
| 5,894,492 A | 4/1999 | Welch et al. | 372/50 |
| 6,072,812 A | 6/2000 | Eng | 372/20 |
| 6,148,017 A | 11/2000 | Borchert et al. | 372/50 |
| 6,151,351 A | 11/2000 | Kito et al. | 372/96 |

FOREIGN PATENT DOCUMENTS

JP    61-168980    7/1986

OTHER PUBLICATIONS

Lu, H., et al., "Dynamic Properties of Partly Gain–Coupled 1.55–μm DFB Lasers," *IEEE Journal of Quantum Electronics*, 31(8): 1443–1450 (Aug. 1995).

Shiao, H.P., et al., "High Performance and High Reliability of 1.55–μm Current–Blocking Grating Complex–Coupled DFB Lasers," *IEEE Photonics Technology Letters*, 10(9): 1238–1240 (Sep. 1998).

(List continued on next page.)

*Primary Examiner*—James Davie
(74) *Attorney, Agent, or Firm*—Hamilton Brook Smith & Reynolds, P.C.

(57) ABSTRACT

An integrated electroabsorption modulated laser (EML) device includes a distributed feedback (DFB) laser and modulator. The DFB laser includes an active layer and a complex index grating. The modulator includes an active layer. The EML device includes a first electrical contact over the DFB laser and a second electrical contact over the modulator. The EML device includes a stop etch layer above the active layer of both the DFB laser and the modulator. An electroabsorption modulated partial grating laser (EMPGL) device includes a distributed feedback (DFB) laser, an amplifier and a modulator. An ion implantation region in the EML/EMPGL devices provides electrical isolation between the DFB laser/amplifier and the modulator.

35 Claims, 9 Drawing Sheets

OTHER PUBLICATIONS

Hong, J., et al., "Impact of Random Facet Phases on Modal Properties of Partly Gain–Coupled Distributed–Feedback Lasers," *IEEE Journal of Selected Topics in Quantum Electronics*, 3(2): 555–568 (Apr. 1997).

Morthier, G., et al., "Improved Performance of AR–Coated DFB Lasers by the Introduction of Gain Coupling," *IEEE Photonics Technology Letters*, 2(3): 170–172 (Mar. 1998).

Tarucha, S., and Okamoto, H., "Monolithic Integration of a Laser Diode and an Optical Waveguide Modulator Having a GaAs/AlGaAs Quantum Well Double Heterostructure," *Appl. Phys. Lett.*, 48(1): 1–3 (Jan. 6, 1986).

Li, G.P., et al., "Partly Gain–Coupled 1.55 $\mu$m Strained–Layer Multiquantum–Well DFB Lasers," *IEEE Journal of Quantum Electronics*, 29(6): 1736–1742 (Jun. 1993).

Tsang, D.Z., et al., "Switching of Low–Threshold Buried–Heterostructure Diode Lasers at 10 GHz," *Appl. Phys. Lett.*, 45(3): 204–206 (Aug. 1, 1984).

Aoki, M., et al., "High–Speed (10 Gbit/s) and Low–Drive–Voltage (1V Peak to Peak) InGaAs/InGaAsP MQW Electroabsorption–Modulator Integrated DFB Laser With Semi–Insulating Buried Heterostructure," *Electronics Letters*, 28(12): 1157–1158 (Jun. 4, 1992).

Kamierski, C., et al., "1.5 $\mu$m DFB Lasers with new Current Induced Gain Gratings," *France–Telecom CNET–Paris*, 1994.

Lammert, R.M., et al., "MQW DBR Lasers with Monolithically Integrated External Cavity Electroabsorption Modulators Fabricated Without Modification of the Active Region," *Photonics Technology Letters, Manuscript No. 5041*, (Dec. 16, 1996).

Lu, H., et al., "High Performance AlGaInAs/InP Strained MQW Lasers for Optical Communication," Presentation at Conference Proceedings, LEOS '96, $9^{th}$ Annual Meeting, Boston, Massachusetts. Nov. 1996.

Stegmüller, B., et al., "Quantum Well Structures for the Integration Laser/Modulator With an Identical Acitve Layer," Photonics Department of ZT, Siemens AG, Munich, Germany. No date given.

Alcatel, Alcatel 1916 LMM 12800 ps/nm WDM 2.5 Gbit/s Digital Laser Module, 1–2. May 1999.

Tsang, D.Z. et al., "IVB–7 Continuous Multi–Gigahertz Modulation of Q–Switched GaInAsP Diode Lasers," *IEEE Transactions on Electron Devices*,30(11)1596–1597 (Nov. 1983).

\* cited by examiner

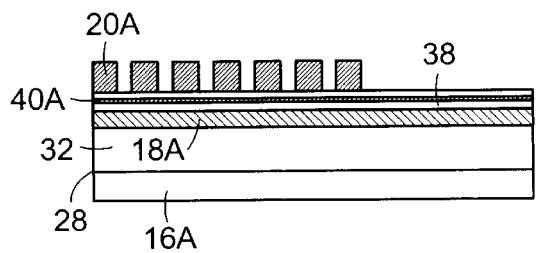
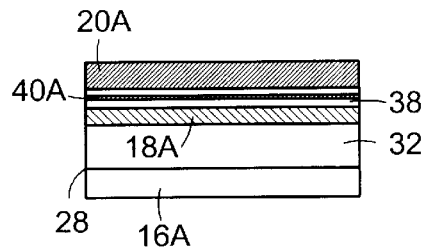
FIG. 8A    FIG. 8B
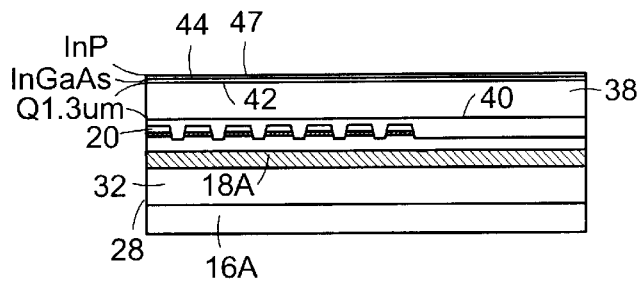
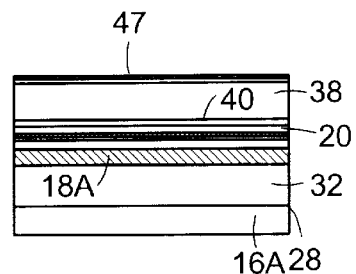
FIG. 9A    FIG. 9B
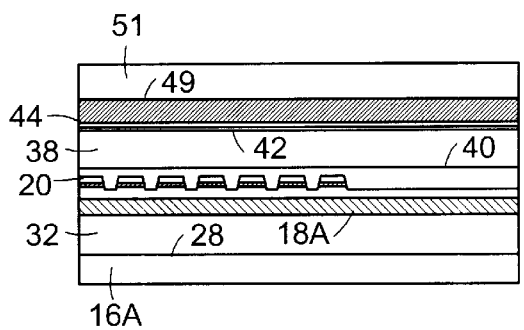
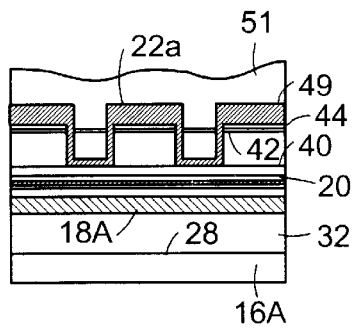
FIG. 10A    FIG. 10B

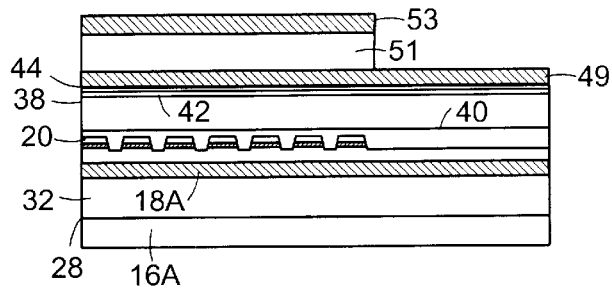
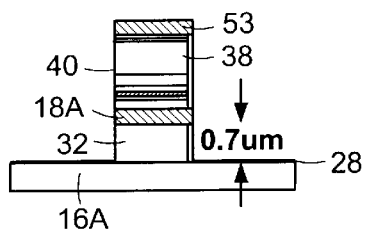
FIG. 11A    FIG. 11B
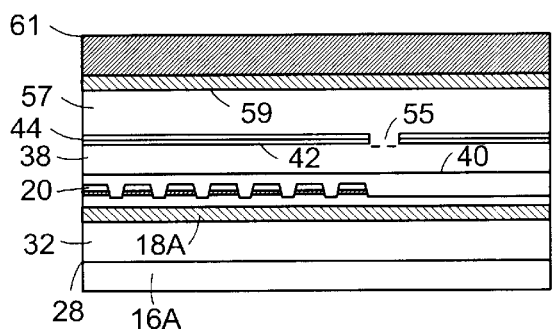
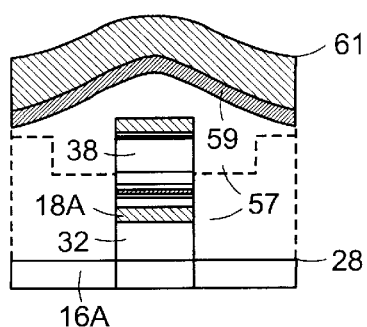
FIG. 12A    FIG. 12B
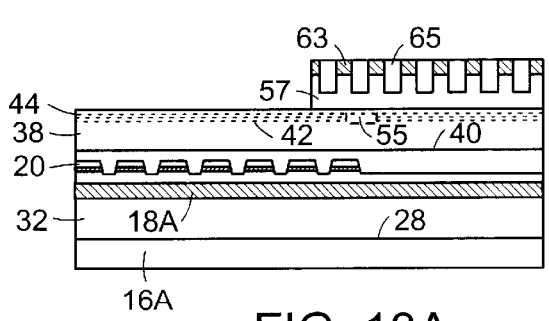
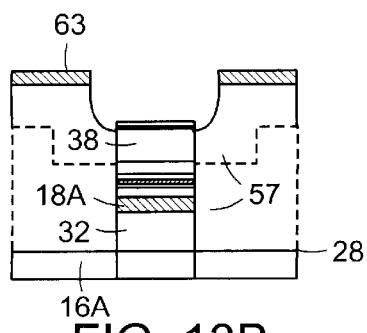
FIG. 13A    FIG. 13B

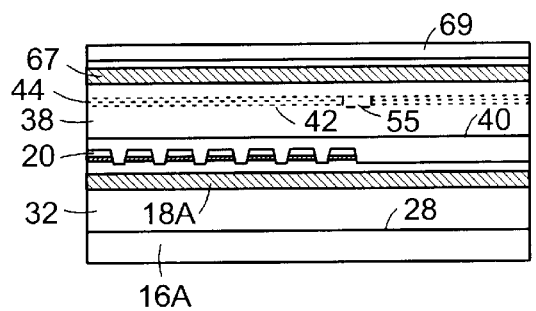
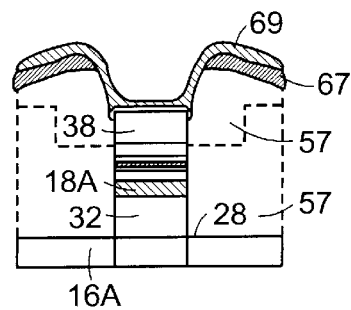
FIG. 14A  FIG. 14B
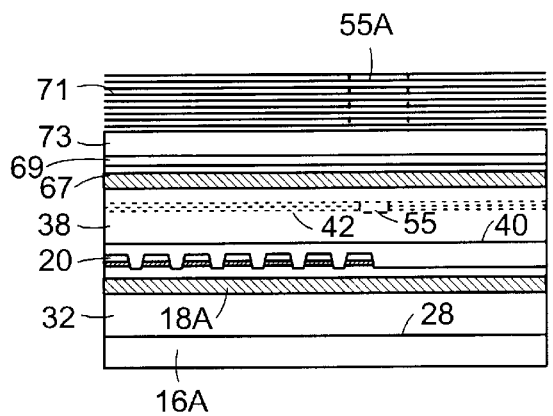
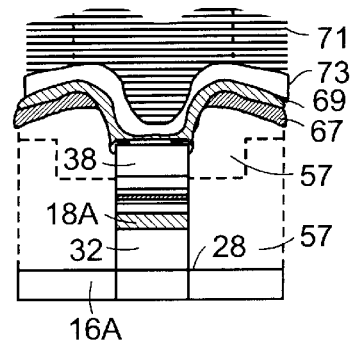
FIG. 15A  FIG. 15B

ELECTROABSORPTION MODULATED LASER

BACKGROUND

Semiconductor laser devices such as ridge waveguide lasers are used in many fiber optic communications systems. Incremental refinements in their fabrication and packaging have resulted in a class of devices that have acceptable performance characteristics and a well-understood long-term behavior. Moreover, the ridge waveguide structures are less complex to fabricate and provide excellent yields as compared to more complex architectures based on buried heterostructures, for example.

Single wavelength lasers have been essential in moderate and long distance (>10 km) fiber optic communication systems. Multimode or multi-wavelength optical transmitters suffer restrictions on the distance information can be sent since pulse spreading is proportional to the product of differential group delay of the fiber and optical bandwidth of the source. For this reason, lasers with multiple transverse modes, multiple lateral modes, or multiple longitudinal modes are to be avoided for moderate and long distance optical communications.

Distributed feedback (DFB) lasers are typically used as optical sources having robust singlemode output. However, direct modulation of a DFB laser tends to induce rapid modulation of the laser index and extensive shifting (or chirp) in the laser oscillation wavelength. Especially large changes in the properties of the laser material are required to rapidly extinguish and rebuild the photon density within the laser cavity on time scales of less than 100 ps. Direct modulated DFBs typically generate a factor of two excess in optical bandwidth. Thus, direct modulated DFBs have inadequate spectra for large signal modulation data rates of 10 Gbit/s and beyond.

Generally, several solutions have been adopted to avoid the chirp of direct modulation. External modulators (using such materials as $LiNO_3$) have produced excellent chirp behavior. However, due to the dissimilarity of the laser and modulator structures, the complexity and thus the size and cost of the resulting transmitter is significantly increased when external modulation is used. Integrated laser and semiconductor Mach-Zehnder modulators have been demonstrated. However, results so far have shown that these devices have high insertion loss.

SUMMARY

Semiconductor waveguide modulators have been integrated with the laser chip to permit subsequent modulation after the laser cavity, eliminating the need to quench and regenerate the photon density within the laser cavity. These have been demonstrated in devices known as electroabsorption modulated lasers (EMLs).

There remains a continuing need for improvements to increase output power, efficiency and spectral characteristics for integrated laser modulator devices.

It would be useful to maintain the advantages of near optimum chirp behavior without trading off a significant fraction of DFB power (permitting one to get >5 mW from the modulator). It would also be useful to maintain the advantage of simple, cheap integration of source and modulator into a single chip.

Electroabsorption modulated laser devices in accordance with the present invention provide increased output power, higher quantum efficiency, and better spectral characteristics compared to typical integrated laser modulators.

According to one aspect of the present invention, an integrated electroabsorption modulated laser (EML) device includes a distributed feedback (DFB) laser and modulator. The DFB laser includes an active layer and a complex index grating. The modulator includes an active layer. The EML device includes a first electrical contact over the DFB laser and a second electrical contact over the modulator. The EML device includes a stop etch layer above the active layer of both the DFB laser and the modulator.

In another aspect, an integrated electroabsorption modulated laser (EML) device includes a distributed feedback (DFB) laser, an amplifier and a modulator and is referred to herein as an electroabsorption modulated partial grating laser (EMPGL) device.

In an embodiment of an EMPGL device, the DFB laser includes an active layer and a complex index grating. The amplifier includes an active layer and a grating-free region. The modulator includes an active layer. The EMPGL device includes a common electrical contact over the DFB laser and amplifier and has a separate electrical contact over the modulator. An ion implantation region in the EMPGL device provides electrical isolation between the DFB laser/amplifier and the modulator.

In another embodiment of an EMPGL device, the EMPGL device includes a modulator between a DFB laser and an amplifier. A first ion implantation region provides electrical isolation between the DFB laser and the modulator and a second ion implantation provides electrical isolation between the amplifier and the modulator. The EMPGL device has separate electrical contacts over the DFB laser, amplifier and modulator.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIGS. 8A, 8B to 15A, 15B illustrate side and front facet views, respectively, of process steps for fabricating an EML device according to the present invention.

DETAILED DESCRIPTION

Reference is now made in detail to the present preferred embodiments of the invention, examples of which are illustrated in the accompanying drawings. Wherever possible, the same reference numbers are used throughout the drawings to refer to the same or like parts.

Figure 1:
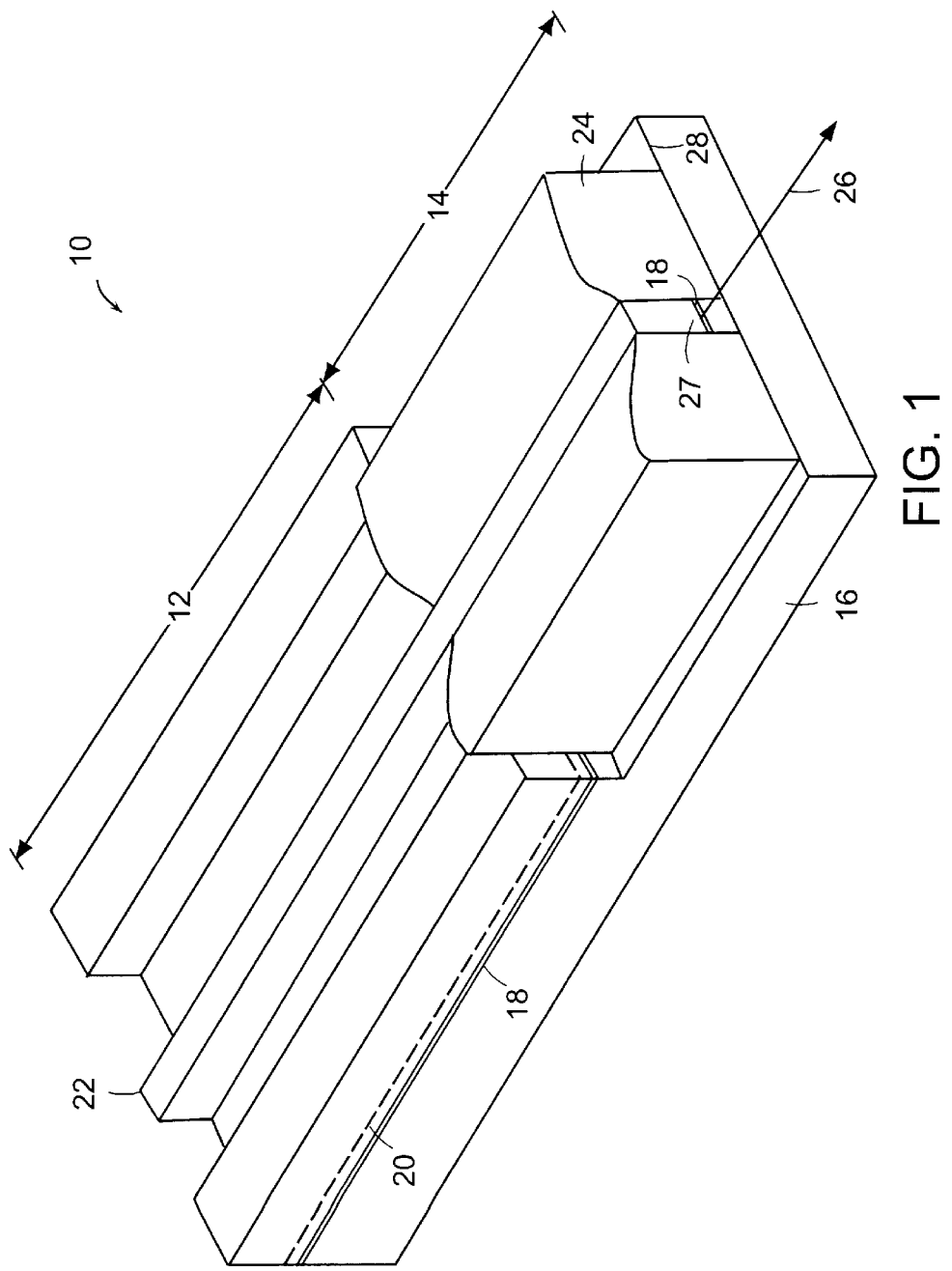
FIG. 1 is a perspective view of an electroabsorption modulated laser (EML) device before metallization and implantation according to the present invention.

An exemplary embodiment of an electroabsorption modulated laser (EML) device of the present invention is shown in FIG. 1, and is designated generally throughout by reference numeral 10. The EML device is shown before metallization and implantation. The device includes a laser 12 and a modulator 14 formed on a semiconductor substrate 16. The laser 12 includes an active layer 18 and a grating 20. The device structure includes a ridge-type waveguide 22 which extends the length of the device. The modulator 14 includes a portion of the active layer 18 and polyimide pads 24 that are formed on an etched region above an etch stop layer 28. A modulated signal 26 exits the device at front facet 27.

Figure 2:
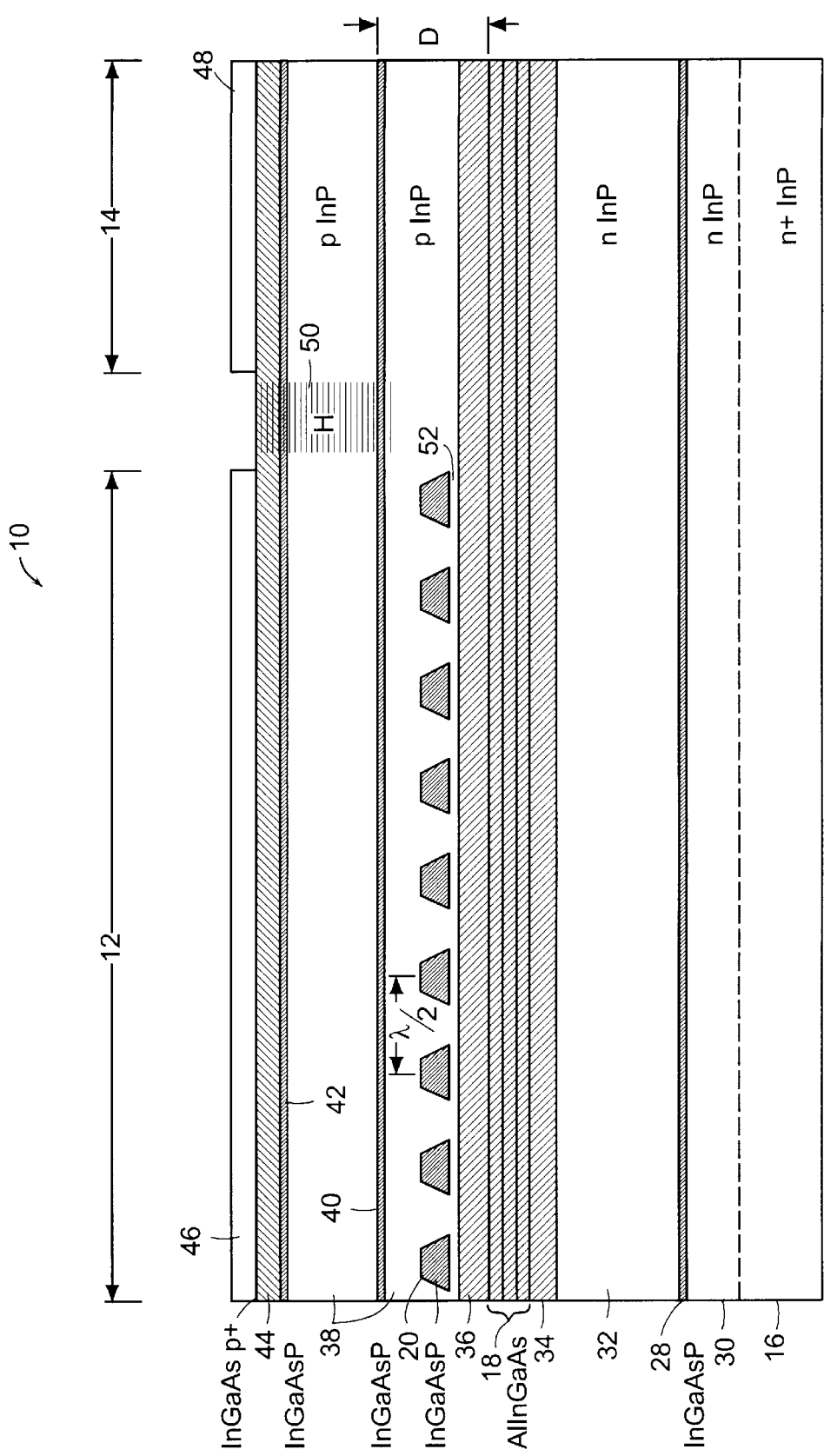
FIG. 2 is a cross-sectional view of the EML device of FIG. 1.

FIG. 2 shows a cross-sectional view of the EML device 10 taken along the length of the ridge waveguide 22 (FIG. 1). The device 10 includes laser and modulator regions 12, 14, respectively. The EML device is constructed on a substrate 16. In the preferred embodiment, the substrate is n+-type indium phosphide (InP). Above the substrate 16 is a buffer layer 30 that is n-type InP. A lower stop etch layer 28 is located above the buffer layer 30. The etch layer 28 is preferably a quaternary indium gallium arsenide phosphide (InGaAsP) material.

In succession above the etch layer are provided a lower cladding layer 32, a lower carrier confinement layer 34, an active layer 18, an upper carrier confinement layer 36 and an upper cladding layer 38. The lower and upper cladding layers 32, 38 provide optical confinement and are preferably of InP of n-type and p-type, respectively. The lower and upper carrier confinement layers 34, 36 confine the holes and electrons in the active layer 18 and are preferably of AlInGaAs. The active layer 18 is a multiple quantum well (MQW) structure which is also of AlInGaAs. The MQW structure includes a succession of wells and potential barriers ranging from 4 to 20, but preferably 8 or 9. A strained MQW structure is preferred as it provides better thresholds and power performance in the laser region 12 and better carrier extraction in the modulator region 14.

A periodic Bragg grating structure 20 is formed in the upper cladding layer 38 in the laser region 12. The Bragg grating is a three level structure of InP/InGaAsP/InP having a periodic spacing of $\lambda/2n$ where $\lambda$ is the emission wavelength of the laser and n is the effective index of refraction of the optical mode. The spacing 52 between the grating and the upper carrier confinement layer 36 is preferably on the order of 0.1 $\mu$m to provide complex coupling which gives better side mode suppression. The grating is typically detuned to a longer wavelength than the photo luminescent wavelength of the active layer. The detuning is typically about 30 to 50 nm.

The resulting layered structure of the laser 12 provides a DFB laser that confines light generated in the active layer 18 primarily within a resonant cavity including the active, carrier confinement, Bragg grating and cladding layers.

Above the upper cladding layer 38 is provided in succession a cap layer 42 of InGaAsP and an electrical contact layer 44 of p+-type InGaAs. Above layer 44 is a top layer that is a metal contact 46 in the laser region 12 and a metal contact 48 in the modulator region 14. In operation the laser contact 46 is positive biased and the modulator contact 48 is negative biased.

A hydrogen proton implantation region 50 provides electrical isolation between the laser and modulator regions 12, 14. Other materials (e.g., helium, iron or carbon) can also be used for implantation, as the required isolation can be obtained by the introduction of a sufficient number of defects into the region so as to lower the conductivity of the region. The proton implantation region extends into the upper cladding layer 38 to a depth that is above the Bragg grating 20 and does not reach the active layer 18. Preferably, the depth of the implantation region 50 is about 1.2 to 1.4 $\mu$m from the top of the electrical contact layer 44. The relatively shallow proton implantation region 50 avoids the complexity associated with known devices in which implantation occurs through the active region followed by partial annealing out of implant damage in order to reduce optical loss.

There is an ever increasing demand for improving power limitations. As data rates increase from 2.5 Gbit/s to 10 Gbit/s to 40 Gbit/s, in order to hold signal-to-noise ratio constant, one must keep the energy per bit constant. This implies that the modulated output power must increase by a factor of four for each of these increases in bit rate. Thus, it is important to provide excellent mode control of the laser waveguide and of the amplifier waveguide. Through extensive optimization of high power lasers it has been found that a weak effective index step in the range of 0.015 or less provides superior mode control for high power performance. This weak index step can be consistently obtained by placing an upper stop etch layer 40 at a distance D ranging from about 0.15 $\mu$m to about 0.3 $\mu$m from the top of the active layer. The upper stop etch layer 40, formed in the upper cladding layer 38 of InGaAsP, is used to define the depth of the ridge waveguide 22 (FIG. 1).

Weak confinement reduces the possibility of higher order optical modes being guided which generally tends to occur with heating of the active layer caused by higher currents. At a larger distance, the effective index of the optical mode is less affected by any materials on top of the semiconductor. Therefore, the distance D is selected to optimize the confinement provided by the device based on desired performance criteria. The optimized placement of the upper stop etch layer 40 provides higher power performance and better wavelength control and yield.

In an embodiment, the upper stop etch layer 40 is placed where the mode intensity profile is about 0.005 of its peak transverse mode intensity. Modal loss is reduced by maintaining doping ~1E17 cm−3 within the >1 um extent from the waveguide center and only using heavier doping in thin regions at layer interfaces.

In other embodiments, different material combinations can be used. For example, InGaAsP/InP is an alternate implementation.

EMLs can avoid the factor of two excess in optical bandwidth associated with direct modulated DFBs. However, chirp can still be significant compared to external electro-optic modulators. Moreover, due to insertion loss, the peak output power can be less than ⅕ the output power of an equivalent DFB laser without an electroabsorption modulator. It is usually necessary to trade off peak output power and chirp performance in order to achieve a laser which meets system operating power requirements.

An EML device referred to herein as an electroabsorption modulated partial grating laser (EMPGL) is now described which improves on the performance of the EML device described above.

Figure 3:
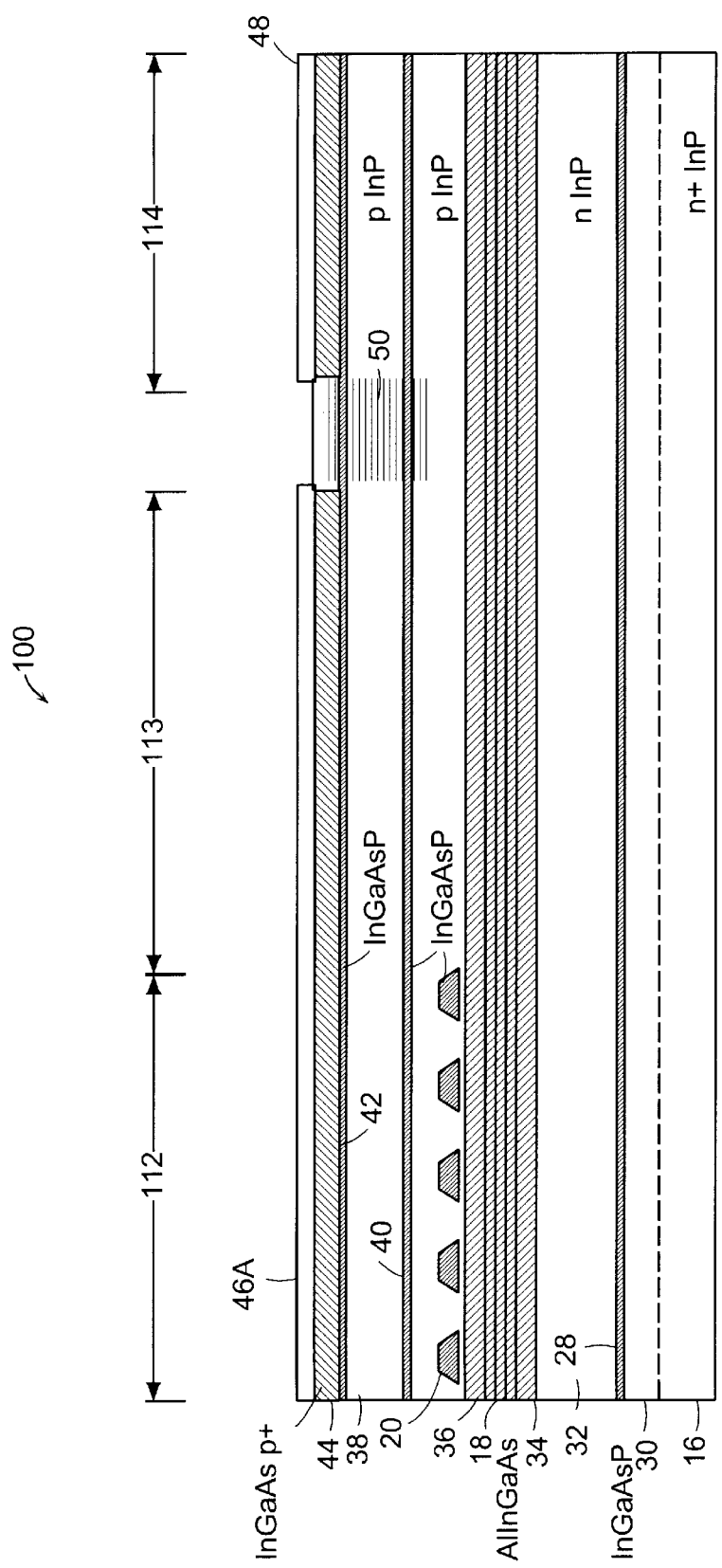
FIG. 3 is a cross-sectional view of an embodiment of an EML device having an integrated amplifier according to the present invention.

FIG. 3 shows a cross-sectional view of an embodiment of an EMPGL device 100. The device 100 includes a laser region 112, a traveling wave amplifier region 113 and a modulator region 114. The laser region 112 is similar to the laser region 12 (FIG. 2) described above. Likewise, the modulator region 114 is similar to the modulator region 14 (FIG. 2) described above. In the EMPGL device 100 the Bragg grating 20 does not extend into the amplifier region 113. There is a single contact 46A over the laser and amplifier regions.

Figure 4:
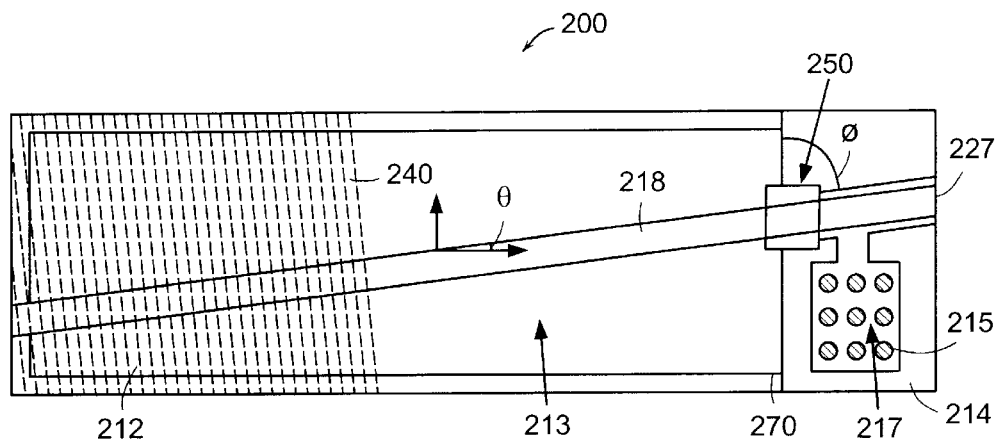
FIG. 4 is a top view of an EML device having an angled configuration.

FIG. 4 shows a top view of an embodiment of an EMPGL device 200 that includes a DFB laser region 212, amplifier region 213 and modulator region 214. A waveguide 218 extends the length of the device 200 and terminates at one end in front facet 227. The laser region 212 includes Bragg grating 240. Modulator region 214 includes modulator pad 217. Dimples 215 are etched into polyimide to assure strong adhesion of metal on the modulator pad 217. Implantation region 250 provides electrical isolation between the laser/amplifier regions 212, 213 and the modulator 214.

Figure 5:
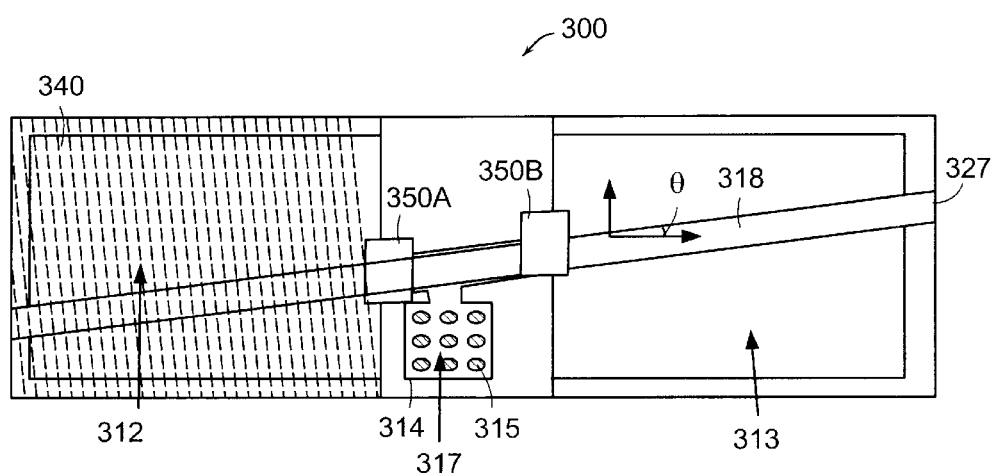
FIG. 5 is a top view of another embodiment of an EML device having an angled configuration.

FIG. 5 shows a top view of another embodiment of an EMPGL device 300 that includes a DFB laser region 312, modulator region 314 and amplifier region 313. A waveguide 318 extends the length of the device 300 and terminates at one end in front facet 327. The laser region includes Bragg grating 340. Modulator region 314 includes modulator pad 317 having dimples 315. In this embodiment, a first implantation region 350A provides electrical isolation between the laser region 312 and the modulator region 314 and a second implantation region 350B provides isolation between modulator region 314 and the amplifier region 313.

In the embodiments shown in FIGS. 4 and 5, the waveguide and grating are at an angle θ (greater than 5° and preferably about 7°) from the crystal axes to reduce potential destabilizing effects from the facet reflectivity. In addition, the etch angle φ with respect to the waveguide at the intersection 270 (FIG. 4) of the laser and the modulator and the amplifier is also greater than 5° and preferably about 7°. Front facet reflectivity is typically <0.5%.

The partial grating laser source of the EMPGL devices of the present invention can significantly increase both efficiency and output power over that of a standard DFB. For example, for a DFB chip with good antireflection facet coatings, as much light is wasted out the back facet as there is usable light emitted from the front. This leads to a significant reduction in efficiency. A more reflective facet coating can be used but leads to large variations in laser performance and will vastly degrade side mode suppression if reflection is strong. The strong back facet reflection reduces the yield of lasers which otherwise would operate in the long wavelength Bragg mode.

Figure 6:
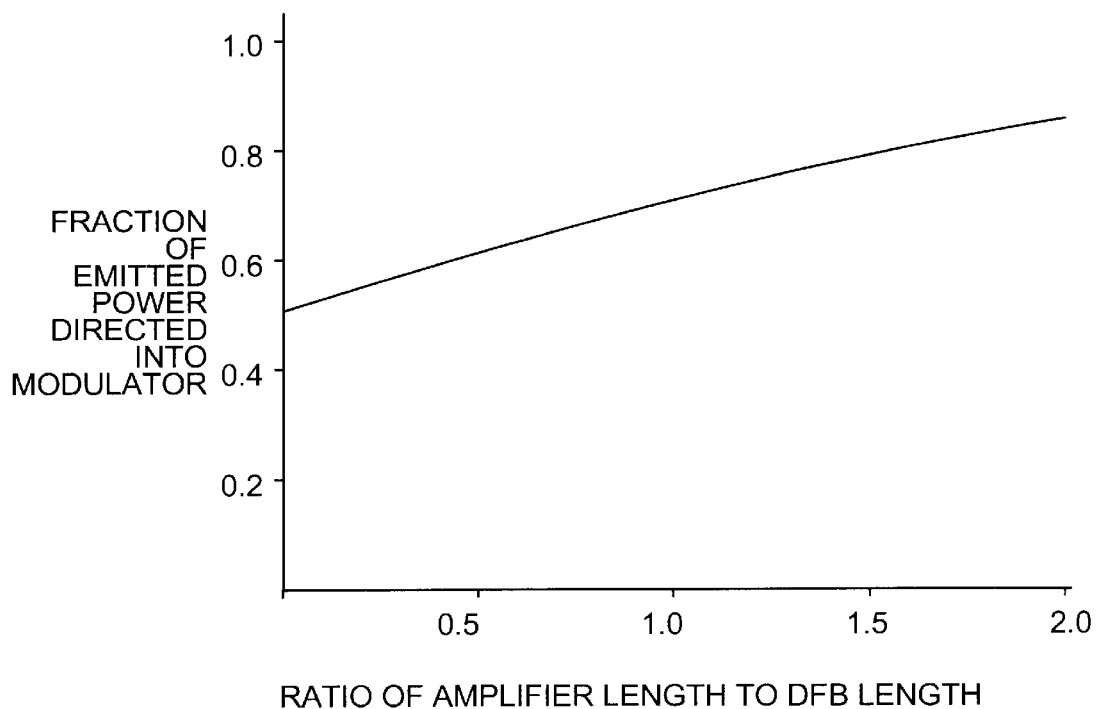
FIG. 6 is a plot of emission efficiency for an exemplary embodiment of an EML device.

The partial grating laser avoids the above-noted factor-of-two reduction in efficiency. Due to the asymmetry of the structure, light is amplified predominantly in one direction (i.e., as it travels away from the laser region) inside the traveling wave amplifier. Essentially, all the carriers injected into the amplifier region can be converted into photons traveling toward the modulator. This asymmetry raises overall device efficiency. For an exemplary EMPGL device with a DFB laser region having $\kappa L=3.0+i1.0$, a modulator region having modal gain coefficient of $\gamma_0=15$ cm−1, saturation power $P_{sat}=58$ mW and amplifier quantum efficiency $\eta=0.6$ pumped with a line current density of 180 mA/mm, the emission efficiency ($P_{mod\_in}/P_{total}$) is plotted in FIG. 6. In particular, this plot shows the fraction of power directed into the modulator versus the ratio of amplifier region length to DFB laser region length.

Figure 7:
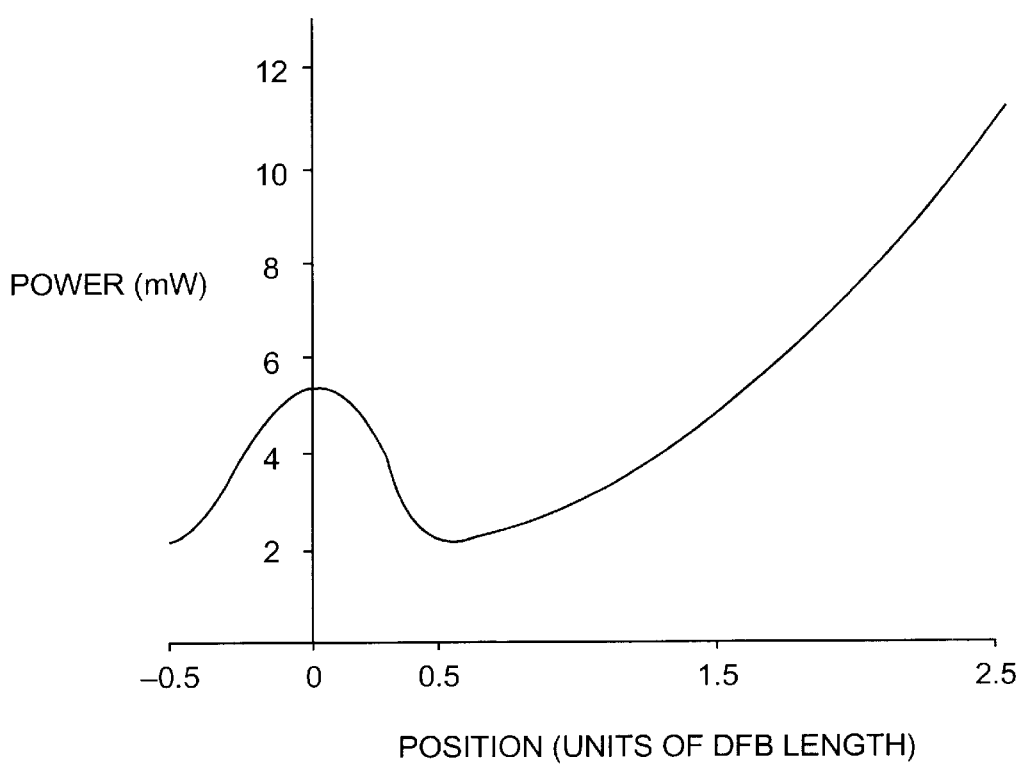
FIG. 7 is a plot of longitudinal power distribution for an exemplary embodiment of an EML device.

It is likely that the ultimate limitation of power from the DFB laser region is due to spatial holeburning or lateral index gradient. These limitations are expected to occur at the same laser power level whether the amplifier region is present or not. Thus, any amount of amplification provided by the amplifier region results in an increase in the usable output power. The amplifier region length provides a new degree of freedom. The increased output power into the modulator is then available for either trading off with chirp requirements to achieve a superior spectral characteristic modulated signal or is available to provide a comparable chirp performance with increased modulated optical signal swing. For a DFB laser region with a maximum output power of 2 mW, FIG. 7 shows the power incident on the modulator for an EMPGL structure. In particular, longitudinal power distribution in the partial grating laser is shown. The plot indicates that a device with amplification region equal to 0.8 the length of the DFB laser region doubles the usable power into the modulator.

Excellent mode control is provided by strong DFB gratings. Apparent in the plot of FIG. 7 is that strong DFB gratings (having large κL) have a very small amount of available power at the DFB output. Thus the optical power is far from the active material's saturation level. This allows rapid, nearly exponential gain before the modulator is reached. The abundance of power permits longer modulators to be used, leading to higher extinction ratios. The abundance of power also permits less positive detuning to be used for the DFB grating, leading to improved chirp and extinction characteristics.

The electrically parallel configuration of DFB and amplifier regions (FIG. 5) can reduce device resistance. The series resistance of other DFB lasers can be a significant source of yield reduction. By achieving the power amplification in a single-pass active waveguide, higher power levels can be obtained while greatly reducing the series resistance of the active region. With reduced series resistance, the EMPGL devices can use lower driver voltages than are required for a typical DFB laser device.

The parallel configuration of the DFB laser and amplifier regions not only helps series resistance performance, but also increase capacitance of the active section. An increased capacitance of the continuous wave (CW) source makes the laser more immune to leakage currents from the AC-modulated section. Chirp from modulator current leakage predominately only affects the CW source wavelength when it is sunk through the DFB laser region. Since the amplifier region is placed between the DFB laser and modulator regions, more than half of the leakage current will be shunted off before reaching the DFB laser region. Thus, the amplifier acts as a bypass capacitor and especially for high frequencies, greatly reduces the effects of an imperfect isolation resistance. This is another physical process by which the EMPGL offers improved chirp performance.

In fabricating the EML and EMPGL devices according to the present invention, epitaxy growth effort can be simplified by using a single epitaxy for modulator, laser, and gain waveguide regions and one additional overgrowth for grating fabrication. Strong gain coupling within the laser region permits large side mode suppression of greater than 50 dB. Reduced feedback from the facets is obtained by defining the ridge waveguide of all sections with a dry etched pattern that is oriented greater than 5 degrees from normal to the crystal cleave plane.

Process steps for fabricating the EML device of FIG. 2 are now described. It should be understood that similar process steps can be used to fabricate the EMPGL device of FIG. 3. Reference is made to FIGS. 8A, 8B through 15A, 15B in the following description of the process steps wherein side (A) and front facet (B) views are provided.

As shown in FIGS. 8A, 8B, an InP substrate and buffer layer jointly designated 16A, lower stop etch layer 28, lower cladding layer 32, active region including upper and lower carrier confinement layers 34, 36 and active layer 18 jointly designated 18A, and upper cladding layer 38 are epitaxially grown using material compositions described above with reference to FIG. 2. A quarternary (InGaAsP) 1.3 μm layer 40A that is used in forming the grating structure 20 (FIG. 2) followed by a thin layer of InP is grown. A photoresist is deposited and exposed to a holographic pattern to provide spaced portions 20A for forming the grating. Following this step, a timed wet etch is used to make the grating and the photoresist 20A is then stripped.

Referring to FIGS. 9A, 9B, overgrowth begins with InP followed by an upper stop etch layer 40 which is a quarternary (InGaAsP) 1.3 μm layer above the grating 20, followed by cap layer 42 of InGaAsP and electrical contact layer 44 of p+-type InGaAs. Above electrical contact layer 44 is grown a protection layer 47 of InP.

Following this step, definition of the ridge waveguide is begun by first removing the protection layer 47 and depositing $SiO_2$-A layer and photoresist. The photoresist is exposed with a ridge mask followed by development and stripping of the photoresist. Using a dry etch ($CH_4/H_2/Ar$), the ridge is etched down into the upper cladding layer 38.

As shown in FIGS. 10A, 10B, a wet etch using $HCl:H_3PO_4$ (1:3) is done down through to upper stop etch layer 40 to further define the ridge 22A. The modulator deep etch is begun by first covering the whole structure with $SiO_2$-A layer 49 followed by a polyimide layer 51 to planarize.

Following this step, a cure up to 200° C. is performed. Referring to FIGS. 11A, 11B, an $SiO_2$-B layer 53 is deposited on the polyimide layer 51 and the modulator is formed using dry etch mask through the active region 18A followed by wet etching through the InP of the lower cladding layer 32 down to the lower stop etch layer 28. FIG. 11B shows only the front view of the modulator section for ease of description.

As shown in FIGS. 12A, 12B, the exposed $SiO_2$-A layer 49, polyimide layer 51 and the $SiO_2$-B layer 53 are removed. Photoresist is applied and exposed with a proton implantation mask followed by a dry etch down to remove a portion 55 of the conductive InGaAs cap layer between the laser and modulator. A final polyimide layer 57 is deposited and cured to begin a polyimide pad. An $SiO_2$ layer 59 and photoresist 61 are deposited.

Referring to FIGS. 13A, 13B, the photoresist is exposed to pattern the polyimide to provide dimples 65 in $SiO_2$ layer 63 on the modulator. The dimpling of the polyimide provides for better connection between metals and the polyimide. Curing is performed up to 450° C.

As shown in FIGS. 14A, 14B, p-metals 69 (e.g., Ti 400 Å/Pt 1000 Å/Au 2500 Å) are deposited over $SiO_2$ layer 67. In FIGS. 15A, 15B, an electroplate mask is used to plate about 1.5 μm Au. A photoresist layer 71 is exposed to a proton implantation mask to define region 55A for implantation processing.

A preferred implantation recipe includes the following sequential dosages and energies:

$6.0E13/cm^2$ @130 keV
$6.0E13/cm^2$ @95 keV
$6.0E13/cm^2$ @65 keV
$6.0E13/cm^2$ @40 keV
$6.0E13/cm^2$ @20 keV

After implantation, the device wafer is thinned, receives Au/Sn n-contact metal, is annealed to 410° C., and is cleaved into bars and facet coated.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An integrated semiconductor device comprising:
   a semiconductor substrate;
   a laser on the substrate having an active layer and a grating that form a laser cavity emitting light at a wavelength determined by the grating;
   a modulator on the substrate having an active layer guiding the light from the laser;
   an implantation region electrically isolating the laser and the modulator, the implantation region extending to a depth above the grating without reaching the active layer.

2. The semiconductor device of claim 1 further comprising a laser contact for applying a forward bias to the laser and a modulator contact for applying a negative bias to the modulator to modulate the guided light.

3. The semiconductor device of claim 1 wherein the active layer of the laser and the active layer of the modulator comprise a continuous layer.

4. The semiconductor device of claim 1 further comprising a stop etch layer at a distance above the active layer that provides an index step of about 0.015 or less.

5. The semiconductor device of claim 1 wherein the active layer of the laser and the active layer of the modulator comprise a continuous waveguide layer that is angled with respect to a front facet of the semiconductor device.

6. The semiconductor device of claim 5 wherein the waveguide angle with respect to the front facet is greater than 5°.

7. The semiconductor device of claim 6 wherein the waveguide angle with respect to the front facet is about 7°.

8. The semiconductor device of claim 1 wherein the active layer of the laser and the active layer of the modulator comprise a continuous waveguide layer that is angled with respect to an etch defined at the intersection of the laser and the modulator.

9. The semiconductor device of claim 8 wherein the waveguide angle with respect to the etch is greater than 5°.

10. The semiconductor device of claim 9 wherein the waveguide angle with respect to the etch is about 7°.

11. The semiconductor device of claim 1 further comprising an amplifier region between the laser and the modulator and wherein the implantation region electrically isolates the laser and amplifier from the modulator.

12. The semiconductor device of claim 11 further comprising a stop etch layer at a distance above the active layer that provides an index step of about 0.015 or less.

13. The semiconductor device of claim 11 wherein the active layers of the laser, amplifier and the modulator comprise a continuous waveguide layer that is angled with respect to a front facet of the semiconductor device.

14. The semiconductor device of claim 13 wherein the waveguide angle with respect to the front facet is greater than 5°.

15. The semiconductor device of claim 14 wherein the waveguide angle with respect to the front facet is about 7°.

16. The semiconductor device of claim 11 wherein the active layers of the laser, amplifier and the modulator comprise a continuous waveguide layer that is angled with respect to an etch defined at the intersection of the laser or amplifier and the modulator.

17. The semiconductor device of claim 16 wherein the waveguide angle with respect to the etch is greater than 5°.

18. The semiconductor device of claim 17 wherein the waveguide angle with respect to the etch is about 7°.

19. The semiconductor device of claim 1 further comprising an amplifier region on the semiconductor substrate and a second implantation region that electrically isolates the amplifier from the modulator.

20. The semiconductor device of claim 19 further comprising a stop etch layer at a distance above the active layer that provides an index step of about 0.015 or less.

21. The semiconductor device of claim 19 wherein the active layers of the laser, amplifier and the modulator comprise a continuous waveguide layer that is angled with respect to a front facet of the semiconductor device.

22. The semiconductor device of claim 21 wherein the waveguide angle with respect to the front facet is greater than 5°.

23. The semiconductor device of claim 22 wherein the waveguide angle with respect to the front facet is about 7°.

24. The semiconductor device of claim 19 wherein the active layers of the laser, amplifier and the modulator comprise a continuous waveguide layer that is angled with respect to an etch defined at the intersection of the laser or amplifier and the modulator.

25. The semiconductor device of claim 24 wherein the waveguide angle with respect to the etch is greater than 5°.

26. The semiconductor device of claim 25 wherein the waveguide angle with respect to the etch is about 7°.

27. An integrated semiconductor device comprising:
a semiconductor substrate;
a laser on the substrate having an active layer and a grating that form a laser cavity emitting light at a wavelength determined by the grating;
a modulator on the substrate having an active layer guiding the light from the laser;
an implantation region electrically isolating the laser and the modulator;
wherein the active layer of the laser and the active layer of the modulator comprise a continuous waveguide layer that is angled with respect to a front facet of the semiconductor device.

28. The semiconductor device of claim 27 wherein the waveguide angle with respect to the front facet is greater than 5°.

29. The semiconductor device of claim 28 wherein the waveguide angle with respect to the front facet is about 7°.

30. The semiconductor device of claim 27 wherein the continuous waveguide layer is angled with respect to an etch defined at the intersection of the laser and the modulator.

31. The semiconductor device of claim 30 wherein the waveguide angle with respect to the etch is greater than 5°.

32. The semiconductor device of claim 31 wherein the waveguide angle with respect to the etch is about 7°.

33. The semiconductor device of claim 27 wherein the active layer comprises AlInGaAs.

34. The semiconductor device of claim 27 wherein the grating is a complex coupled Bragg grating.

35. The semiconductor device of claim 27 further comprising a stop etch layer at a distance above the active layer that provides an index step of about 0.015 or less.

* * * * *